US012696440B2

(12) United States Patent
Huang et al.

(10) Patent No.: US 12,696,440 B2
(45) Date of Patent: Jul. 28, 2026

(54) SEMICONDUCTOR STRUCTURE AND METHOD OF MANUFACTURING THE SAME

(71) Applicant: Winbond Electronics Corp., Taichung City (TW)

(72) Inventors: Tzu-Hsun Huang, Chiayi City (TW); Yi-Hao Chien, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 599 days.

(21) Appl. No.: 18/180,588

(22) Filed: Mar. 8, 2023

(65) Prior Publication Data

US 2024/0306367 A1 Sep. 12, 2024

(51) Int. Cl.
H10B 12/00 (2023.01)
H10D 30/63 (2025.01)
H10D 64/27 (2025.01)

(52) U.S. Cl.
CPC ......... H10B 12/315 (2023.02); H10B 12/053 (2023.02); H10B 12/482 (2023.02); H10B 12/488 (2023.02); H10D 30/63 (2025.01); H10D 64/513 (2025.01)

(58) Field of Classification Search
CPC .. H10B 12/315; H10B 12/053; H10B 12/482; H10B 12/488; H10D 30/63; H10D 64/513
See application file for complete search history.

(56) References Cited

U.S. PATENT DOCUMENTS

2015/0294923 A1* 10/2015 Shin ..................... H10B 12/033
257/532
2022/0399456 A1 12/2022 Kim et al.

OTHER PUBLICATIONS

Taiwan Office Action dated Sep. 21, 2023 in Application No. 111149924 is attached, 4 pages.

* cited by examiner

*Primary Examiner* — Samuel A Gebremariam
(74) *Attorney, Agent, or Firm* — MUNCY, GEISSLER, OLDS & LOWE. P.C.

(57) ABSTRACT

A semiconductor structure includes a substrate, several buried word lines in the substrate, a dielectric material layer on the substrate, a semiconductor material layer on the dielectric material layer, and several contacts disposed on the substrate. The substrate includes several active regions and isolation structures that surround the active regions. The contacts are adjacent to the semiconductor material layer, and penetrate the semiconductor material layer, the dielectric material layer and parts of the substrate. The contacts are positioned in the respective active regions.

18 Claims, 6 Drawing Sheets

SEMICONDUCTOR STRUCTURE AND METHOD OF MANUFACTURING THE SAME

BACKGROUND

Technical Field

The disclosure relates to a semiconductor structure and method of manufacturing the same, and it relates to a semiconductor structure of a dynamic random access memory (DRAM) and method of manufacturing the same.

Description of the Related Art

Current methods of manufacturing dynamic random access memory (DRAM) devices continue to improve with respect to reducing the device size. As device sizes continue to shrink, many challenges arise. For example, several patterning processes with precise steps are performed on the semiconductor structure in an array region and a periphery region to fabricate features of a device with smaller dimensions. However, this increases the overall processing time and makes the production cost quite expansive. Therefore, although existing methods of manufacturing dynamic random access memory devices have generally been adequate for their intended purposes, they have not been entirely satisfactory in all respects. In particular, there are still some problems that are caused by reductions in device size that have yet to be overcome in regards to the patterning processes for manufacturing dynamic random access memory devices.

SUMMARY

Some embodiments of the present disclosure provide a semiconductor structure. A semiconductor structure includes a substrate, buried word lines disposed in the substrate, a dielectric material layer formed on the substrate, a semiconductor material layer formed on the dielectric material layer and several contacts adjacent to the semiconductor material layer. The substrate includes active regions and isolation structures, and the isolation structures surround the active regions. The contacts penetrate the semiconductor material layer, the dielectric material layer and parts of the substrate, and the contacts are positioned in the respective active regions. In some embodiments, the semiconductor structure further includes doping regions that are disposed between the semiconductor material layer and the respective contacts, so that the semiconductor material layer can be separated from the contacts.

Some embodiments of the present disclosure provide a method of manufacturing a semiconductor structure. A method of manufacturing a semiconductor structure includes providing a substrate; forming a dielectric material layer on the substrate; forming a semiconductor material layer on the dielectric material layer; forming contact openings that penetrate the semiconductor material layer, the dielectric material layer and parts of the substrate, wherein the contact openings expose the substrate; and forming contacts in the contact openings. The substrate includes active regions and isolation structures that surround the active regions, and several buried word lines are disposed in the substrate. The contacts are disposed adjacent to the semiconductor material layer, and the contacts are positioned in the respective active regions. In some embodiments, the method of manufacturing the semiconductor structure further includes forming doping regions on the sidewalls of the semiconductor material layer, and the doping regions are exposed in the contact openings.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1:
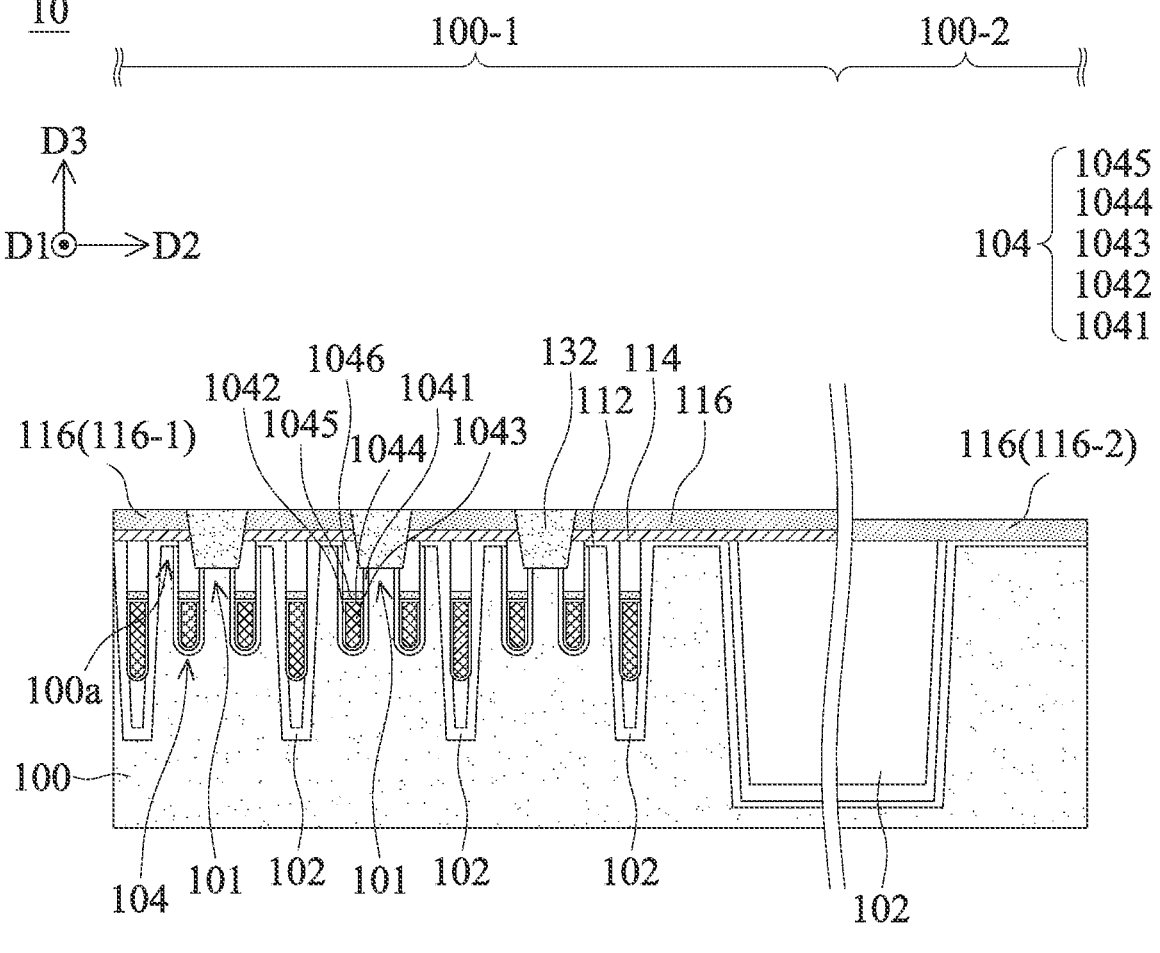
FIG. 1 is a cross-sectional view of an intermediate stage of a semiconductor structure in accordance with an embodiment of the present invention.

FIG. 1 is a cross-sectional view of an intermediate stage of a semiconductor structure in accordance with an embodiment of the present invention. A semiconductor structure 10 includes a substrate 100. The substrate 100 includes several doping regions as active regions 101, several isolation structures 102 that surround the active regions 101, and several buried word lines 104 disposed in the substrate 100.

The substrate 100 may include a semiconductor material. In some embodiments, the substrate 100 includes silicon, gallium arsenide, gallium nitride, germanium silicide, another suitable substrate material, or a combination of the foregoing materials. In some other embodiments, the substrate 100 is a silicon-on-insulator (SOI) substrate. Each of the active regions 101 is arranged substantially in the direction D1 and tilted at an angle (not shown) with respect to the direction D1. In some embodiments, the substrate 100 further includes an array region 100-1 and a periphery region 100-2. The periphery region 100-2 is adjacent to the array region 100-1.

In some embodiments, the isolation structures 102 that surround the active regions 101 are shallow trench isolation structures or another isolation features. For example, each of the isolation features may include an isolation liner and an isolation filler. Formation of the isolation liners and the isolation fillers may include one or more patterning processes (such as lithography patterning processes and etching processes), one or more deposition processes and one or more planarization processes. The aforementioned deposition processes include one or more chemical vapor deposition (CVD) processes, and the aforementioned planarization processes include one or more chemical mechanical polishing (CMP) processes. It should be noted that, in some embodiments, the exemplified isolation structures 102 as shown in FIG. 1 are provided for illustrative purposes, and the embodiments of the present disclosure are not limited thereto.

In one embodiment, each of the buried word lines 104 includes a gate dielectric layer 1041, a barrier layer 1042, another barrier layer 1044, a work function layer 1043 and another work function layer 1045, as shown in FIG. 1. In this exemplified embodiment, those buried word lines 104 extend in the direction D1 and are separated from each other in the direction D2. The direction D1 is different from the direction D2.

In one embodiment, several trenches (not shown) are formed in the array region 100-1 of the substrate 100 by a patterning process. Then, the gate dielectric layers 1041 are formed in the respective trenches. In addition, in some embodiments, the gate dielectric layer 1041 is a single layer structure or a multilayer structure. In addition, the gate dielectric layer 1041 may include silicon oxide, silicon nitride, another suitable material, or a combination of the foregoing materials.

In one embodiment, in each of the trenches, the barrier layer 1042 is formed on the gate dielectric layer 1041, and the barrier layer 1044 is formed on the work function layer 1043 and the barrier layer 1042. The barrier layers 1042 and the barrier layers 1044 may include the same material or include different materials. The barrier layers 1042 and the barrier layers 1044 may include one or more conductive metals. For example, the barrier layers 1042 and the barrier layers 1044 include metal, metal alloy, metal nitride, or metal silicide. In some embodiments, the barrier layers 1042 and the barrier layers 1044 include titanium nitride (TiN), titanium silicon nitride (TiSiN), tantalum nitride (TaN), tungsten nitride (WN), tantalum (Ta), titanium (Ti), tungsten (W), ruthenium (Ru), aluminum (Al), another suitable conductive material, or a combination of foregoing materials. In one embodiment, the barrier layer 1042 and the barrier layer 1044 can be formed by using a deposition process, such as CVD, physical vapor deposition (PVD), atomic layer deposition (ALD), or another suitable process.

In one embodiment, the work function layers 1043 are formed on the barrier layers 1042. The work function layers 1043 may include one or more conductive metals. For example, the work function layers 1043 include metal, metal alloy, metal nitride, or metal silicide. In some embodiments, the work function layers 1043 include W, Ta, Ti, Ru, Al, WN, TiN, TiSiN, TaN, or a combination of foregoing materials. In some embodiments, the work function layers 1043 can be formed by using a deposition process, such as PVD, CVD, ALD, or another suitable process. In one embodiment, the barrier layers 1042 include TiN, and the work function layers 1043 include W.

In one embodiment, after the materials of the gate dielectric layers 1041, the barrier layers 1042 and the work function layers 1043 are deposited on the substrate 100, the excess portions of the barrier layers 1042 and the work function layers 1043 are removed by an etching back process. After the etching back process is performed, the top surfaces of the barrier layers 1042 and the work function layers 1043 are lower than the top surface 100a of the substrate 100. Next, in some embodiments, the barrier layers 1044 can be formed by using any suitable process (such as a deposition process). In each of the trenches for forming buried word lines 104, the barrier layer 1044 covers the work function layer 1043 and the barrier layer 1042.

In one embodiment, the work function layers 1045 are formed on the barrier layers 1044. The work function layers 1045 may include doped or undoped polysilicon, metal, metal alloy, metal nitride, or metal silicide. In some embodiments, the work function layers 1045 include polysilicon, TiN, TiSiN, TaN, WN, Ta, Ti, W, Ru, Al, or a combination of foregoing materials. In some embodiments, the work function layers 1045 can be formed by using a deposition process, such as PVD, CVD, ALD, or another suitable process. After the material of the work function layers 1045 is deposited on the substrate 100, the excess portion of the material of the work function layers 1045 can be removed by an etching back process or another suitable process to recess the material of the work function layers 1045. Accordingly, the top surfaces of the work function layers 1045 are lower than the top surface 100a of the substrate 100. After the work function layers 1045 are formed, the gate dielectric layer 1041, the barrier layer 1042, the barrier layer 1044, the work function layer 1043 and the work function layers 1045 are collectively referred to as the buried word lines 104. In some embodiments, the material of the work function layers 1045 is different from the materials of the barrier layers 1042, the barrier layers 1044 and the work function layers 1043.

Next, an insulating layer 1046 is formed in each of the trenches for forming the buried word lines 104, and the insulating layer 1046 is formed on the buried word line 104. For example, the insulating layer 1046 is formed on the work function layers 1045, as shown in FIG. In this exemplified embodiment, the insulating layer 1046 covers the work function layers 1045 and the gate dielectric layer 1041. In addition, in some embodiments, the insulating layer 1046 is a single layer structure or a multilayer structure. To simplify the diagram, a single-layer insulating layer 1046 is depicted for clear illustrations.

In one embodiment, the material of the insulating layers 1046 includes, for example, nitride, oxide, another suitable dielectric material, or a combination of the foregoing materials. In some embodiments, the insulating layers 1046 include silicon nitride, silicon oxide, another suitable material, or a combination of the foregoing materials. The insulating layer 1046 can be a single layer or multiple layers of insulating material. In some embodiments, the insulating layers 1046 and the gate dielectric layers 1041 may include different insulating materials. In addition, the insulating layers 1046 can be formed by PVD, CVD, ALD, spin-coating process, another suitable process, or a combination of the foregoing processes.

Next, a dielectric material layer is formed on the substrate 100, in accordance with some embodiments of the present disclosure. The dielectric material layer extends over the array region 100-1 and the periphery region 100-2 of the substrate 100. In one embodiment, the dielectric material layer includes several layers of different dielectric materials. In this exemplified embodiment, the dielectric material layer includes, for example, a nitride layer (such as silicon nitride) 112 on the top surface 100a of the substrate 100, and an oxide layer (such as silicon oxide) 114 on the nitride layer 112.

Next, a semiconductor material layer 116 is formed over the dielectric material layer (for example, including the nitride layer 112 and the oxide layer 114), in accordance with some embodiments of the present disclosure. As shown in FIG. 1, the semiconductor material layer 116 extends over the array region 100-1 and the periphery region 100-2 of the substrate 100.

In one embodiment, the semiconductor material layer 116 is an undoped semiconductor layer. In another embodiment, the semiconductor material layer 116 is a doped semiconductor layer, which may include p-type dopants or n-type dopants. The dopants of the semiconductor material layer 116 can be selected according to actual application requirements. In this exemplified embodiment, the semiconductor material layer 116 is a polysilicon layer.

In one embodiment, the semiconductor material layer 116 includes a semiconductor material portion 116-1 and a semiconductor material portion 116-2 respectively formed in the array region 100-1 and the periphery region 100-2 of the substrate 100. In addition, the semiconductor material portion 116-1 and the semiconductor material portion 116-2 may include the same dopants or include different dopants.

In one embodiment, the semiconductor material portion 116-2 that extends over the periphery region 100-2 can form parts of the peripheral conductive wires in the subsequent processes. According to the manufacturing processes of some embodiments, after the semiconductor material layer 116 is formed, it is not necessary to remove the semiconductor material portion 116-1 that extends over the array region 100-1, so as to reduce the manufacturing cost of the semiconductor structure.

After the semiconductor material layer 116 is formed, several contact openings are formed in the semiconductor material layer 116 and the dielectric material layer (such as including the oxide layer 114 and the nitride layer 112) in the array region 100-1 of the substrate 100. These contact openings extend in the direction D3, and portions of the substrate 100 are removed during formation of the contact openings. Next, in some embodiments, a conductive material is filled into the contact openings, and one or more suitable processes are performed on the conductive material, thereby forming several contacts 132.

Figures 2A, 2B:
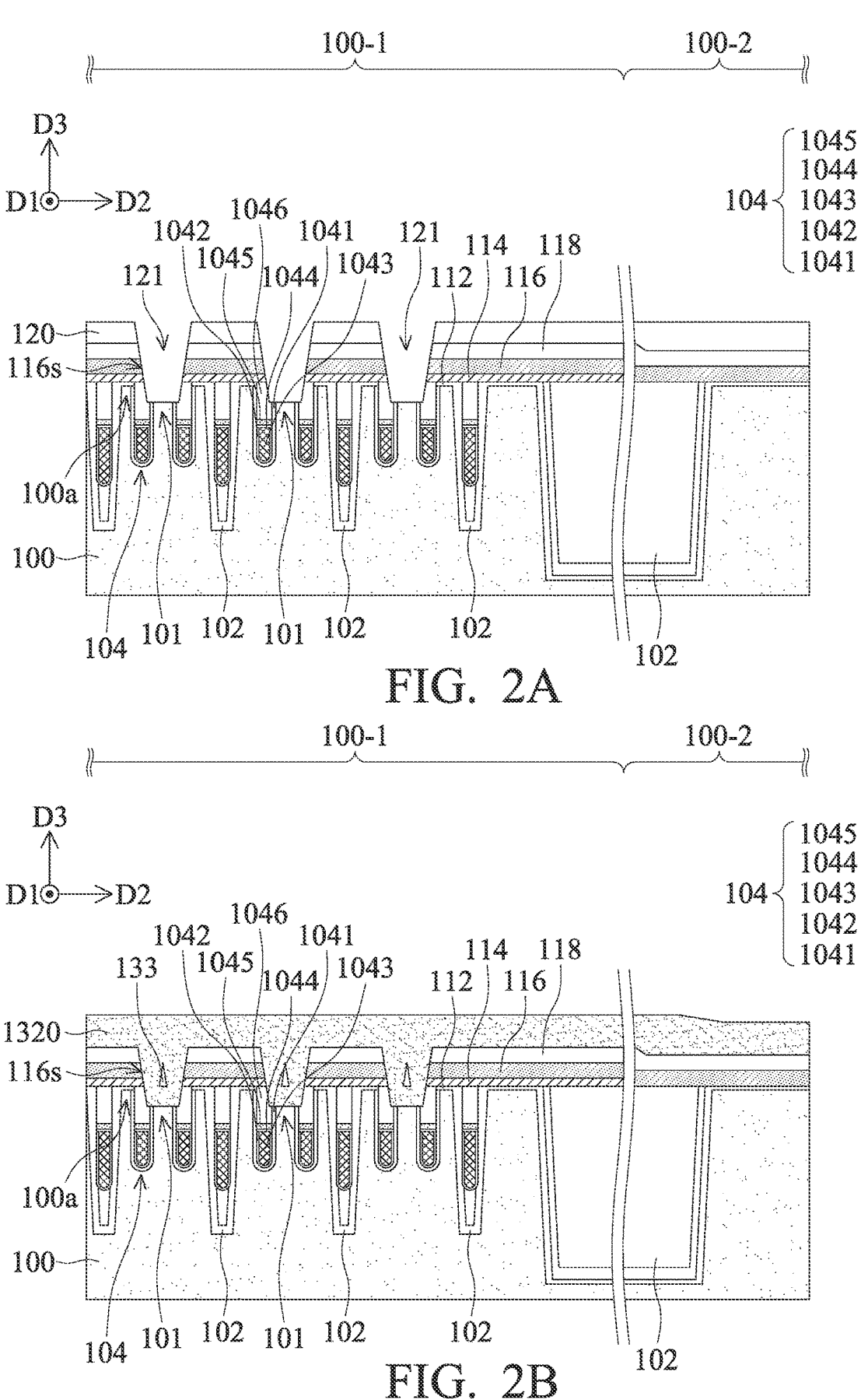
FIG. 2A and FIG. 2B are cross-sectional views of the intermediate stage of a semiconductor structure in accordance with an embodiment of the present invention.

FIG. 2A and FIG. 2B are cross-sectional views of the intermediate stage of a semiconductor structure in accordance with an embodiment of the present invention. The features/components in FIG. 2A and FIG. 2B similar or identical to the features/components in FIG. 1 are designated with similar or the same reference numbers, and the details of those similar or the identical features/components can be referred to the related contents in the aforementioned descriptions. In addition, to briefly describe this exemplified embodiment, the features/components in FIG. 2A and FIG. 2B that are similar or identical to the features/components in FIG. 1 and the fabrication processes for forming those features/components are not repeated herein for the sake of simplicity and clarity.

In one embodiment, after the dielectric material layer (such as including the nitride layer 112 and the oxide layer 114) and the semiconductor material layer 116 are formed over the substrate 100 (that includes the active regions 101, the isolation structures 102 and the buried word lines 104), a mask material is formed on the semiconductor material layer 116. In one exemplified embodiment, the mask material includes a mask layer 118 on the semiconductor material layer 116 and another mask layer 120 on the mask layer 118, as shown in FIG. 2A.

The material of the mask layer 118 may include silicon oxide, silicon nitride, another suitable material or a combination of the forgoing materials. The material of the mask layer 120 includes, for example, a material of a hard mask. In one embodiment, the mask layer 120 is a carbon-containing layer that includes carbides, for example, diamond-like carbon, an amorphous carbon film, and a highly selective transparent carbon-containing layer. In this exemplified embodiment, the mask layer 118 includes an oxide layer, such as a tetraethoxysilane (TEOS) layer, and the mask layer 120 includes a carbon-containing layer.

Next, referring to FIG. 2A again, several contact openings 121 are formed in the array region 100-1 of the substrate 100. In this exemplified embodiment, the contact openings 121 extend downward in the direction D3, and penetrate through the mask layer 120, the mask layer 118, the semiconductor material layer 116 and the dielectric material layer (e.g., the oxide layer 114 and the nitride layer 112). In addition, these contact openings 121 remove portions of the substrate 100. Therefore, the formed contact openings 121 are separated from each other in the direction D2, and the contact openings 121 expose the active regions 101 of the substrate 100.

Next, referring to FIG. 2B, the mask layer 120 is removed to expose the top surface of the mask layer 118. Next, a conductive material layer 1320 is deposited on the substrate 100. The conductive material layer 1320 covers the mask layer 118 and fills the contact openings 121. The conductive material layer 1320 includes doped polysilicon, metal, metal nitride, or another suitable material. In one embodiment, the conductive material layer 1320 can be formed by using a deposition process such as PVD, CVD, ALD, or another suitable process. Subsequently, the conductive material layer 1320 is planarized to form the contacts (not shown) in the respective contact openings 121.

However, for a semiconductor structure with small dimensions, the width of each of the contact openings 121 is relatively narrow. When a conductive material is deposited in the contact openings 121 to form the contacts, seams 133 would be easily because the contact openings 121 would not be fully filled with the conductive material. FIG. 2B shows that the conductive material has several seams 133 that generate in the respective contact openings 121. Therefore, an embodiment of the present disclosure provides a method of manufacturing a semiconductor structure that can avoid the occurrence of the seams 133, so as to solve the problem that the contact openings 121 cannot be fully filled when the conductive material layer is deposited in the contact openings 121.

FIG. 3A to FIG. 3H are cross-sectional views of the intermediate stage of a method of manufacturing a semiconductor structure, in accordance with one embodiment of the present invention. For the sake of simplicity and clarity of description, the features/components in FIG. 3A to FIG. 3H similar or identical to the features/components in FIG. 1, FIG. 2A and FIG. 2B are designated with similar or the same reference numbers, and the details of those similar or the identical features/components can be referred to the related contents in the aforementioned descriptions. In addition, to briefly describe this exemplified embodiment, the features/components in the periphery region are omitted in FIG. 3A to FIG. 3H. Only the features/components in the array region are depicted in FIG. 3A to FIG. 3H for the sake of simplicity and clarity.

Figure 3A:
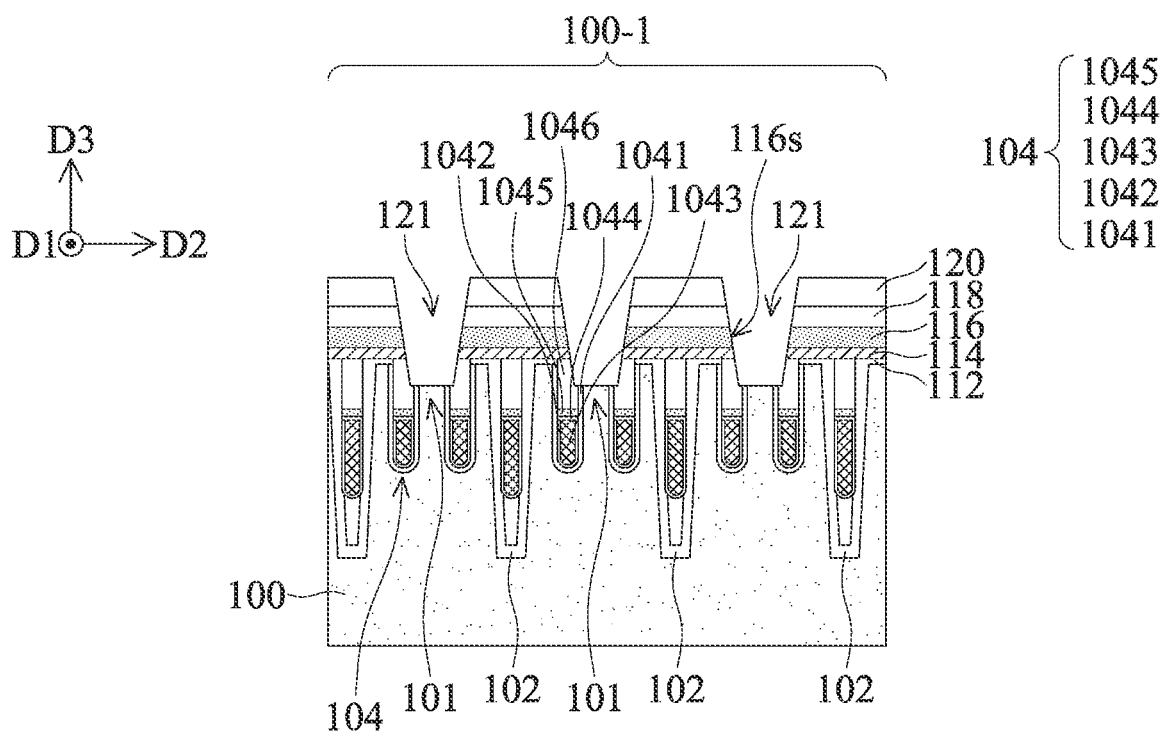
FIG. 3A, FIG. 3B, FIG. 3C, FIG. 3D, FIG. 3E, FIG. 3F, FIG. 3G and FIG. 3H are cross-sectional views of the intermediate stage of a method of manufacturing a semiconductor structure, in accordance with one embodiment of the present invention.

Referring to FIG. 3A, after the dielectric material layer (such as including the nitride layer 112 and the oxide layer 114) and the semiconductor material layer 116 are formed over the substrate 100 (that includes the active regions 101, the isolation structures 102 and the buried word lines 104), a mask material is formed on the semiconductor material layer 116. As shown in FIG. 3A, in one exemplified embodiment, the mask material includes a mask layer 118 on the semiconductor material layer 116 and another mask layer 120 on the mask layer 118. In this exemplified embodiment, the mask layer 118 includes an oxide layer, such as a tetraethoxysilane (TEOS) layer, and the mask layer 120 includes a carbon-containing layer.

Next, several contact openings 121 are formed in the array region 100-1 of the substrate 100. In this exemplified embodiment, the contact openings 121 penetrate through the mask layer 120, the mask layer 118, the semiconductor material layer 116 and the dielectric material layer (e.g., the oxide layer 114 and the nitride layer 112). In addition, these contact openings 121 remove portions of the substrate 100. As shown in FIG. 3A, the formed contact openings 121 are separated from each other in the direction D2, and the contact openings 121 expose the respectively active regions

101 of the substrate 100, in accordance with some embodiments of the present invention.

In one embodiment, a surface treatment is performed on the sidewalls 116s of the semiconductor material layer 116 that are exposed in the respective contact openings 121, so that it is difficult to rapidly form chemical bonds between the sidewalls 116s of the semiconductor material layer 116 and the material of the conductive material layer. Therefore, a deposition rate of the conductive material layer that is deposited on the sidewalls 116s of the semiconductor material layer 116 in the contact opening 121 can be decreased, in accordance with some embodiments of the present invention. In one embodiment, the aforementioned surface treatment includes, for example, roughening or amorphizing the sidewalls 116s of the semiconductor material layer 116, or forming a heterogeneous material layer, or a combination of the aforementioned treatments.

Figure 3B:
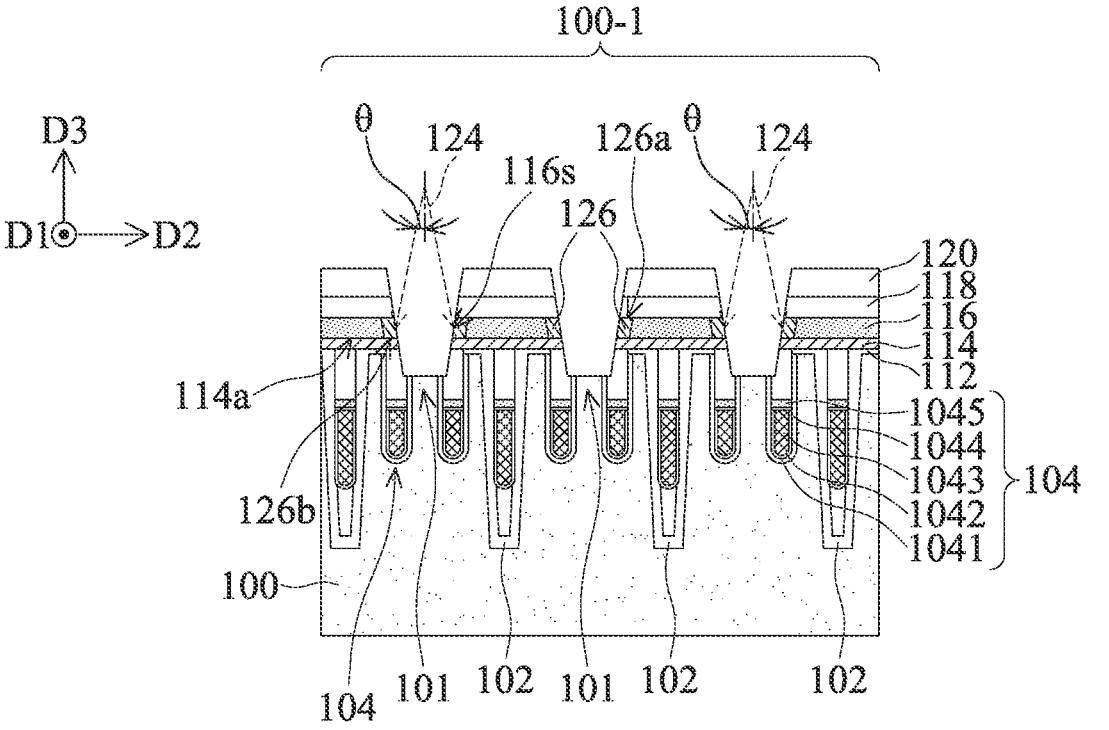

As shown in FIG. 3B, after the contact openings 121 are formed, several amorphous regions, such as several doping regions 126 that include amorphous material, are formed at the sidewalls 116s of the semiconductor material layer 116, in accordance with an embodiment of the present invention. The doping regions 126 are exposed in the contact openings 121. For example, in a top view of the substrate 100, each of the doping regions 126 surrounds the sidewalls of the respective contact openings 121 and forms a closed shape.

In one exemplified embodiment, a pre-amorphization ion implantation (PAI) 124 is performed on the sidewalls 116s of the semiconductor material layer 116 that are exposed in the respective contact openings 121 to form the doping regions 126. In one embodiment, germanium, silicon and/or carbon are implanted into the sidewalls 116s of the semiconductor material layer 116 during the pre-amorphization ion implantation 124, as indicated by the arrows in FIG. 3B. In other embodiments, one or more inert gases such as neon, argon, krypton, xenon, and radon can be further added and implanted into the sidewalls 116s of the semiconductor material layer 116. The pre-amorphization ion implantation 124 that is performed on the sidewalls 116s of the semiconductor material layer 116 can change the lattice structures of the implanted regions (doping regions 126) of the semiconductor material layer 116. Thus, at least the portions of the semiconductor material layer 116 that are exposed in the contact openings 121 will be transformed into an amorphous state. In one exemplified embodiment, the doping regions 126 can also be referred to as amorphous regions.

The doping regions 126 may include germanium, silicon, carbon, another suitable material, or a combination of the foregoing materials. In this exemplified embodiment, after the pre-amorphization ion implantation 124 is performed, the doping regions 126 include germanium.

In one embodiment, the bottom surfaces 126b of the formed doping regions 126 are in contact with the dielectric material layer, for example, in contact with the top surface of the oxide layer 114. For example, as shown in FIG. 3B, after the pre-amorphization ion implantation 124 is performed, the top surfaces 126a of the formed doping regions 126 may be in contact with the mask layer 118. In the subsequent processes, after the bit line 142 (FIG. 3H) are formed, the top surfaces 126a of the doping regions 126 are, for example, in contact with the bottom surface 142b of the bit line 142. Therefore, in some embodiments, the doping regions 126 that are in the amorphous state can provide physical and electrical isolation between the semiconductor material layer 116 and the subsequently formed contacts.

In one embodiment, the ion implantation can be performed on at least the sidewalls 116s of the semiconductor material layer 116 by adjusting an implantation angle θ of the pre-amorphization ion implantation 124. As shown in FIG. 3B, the formed doping regions 126 extend at least from the top surface of the dielectric material layer (such as the top surface of the oxide layer 114) to the bottom surface of the mask material (such as the bottom surface of the mask layer 118). The implantation angle θ can be adjusted in a suitable range such that the surface states of the sidewalls 116s of the semiconductor material layer 116 can be changed (for example, from a polycrystalline state to an amorphous state) without damaging the surface of the active regions 101.

Before or after the pre-amorphization ion implantation 124 is performed, one or more cleaning processes are performed to clean the contact openings 121. In some embodiments, the first cleaning process can be performed on the contact openings 121 before the pre-amorphization ion implantation 124 is performed, and the second cleaning process can be performed on the contact openings 121 after the pre-amorphization ion implantation 124 is performed. The present disclosure does not limit the cleaning process is performed in a particular sequence.

Figure 3C:
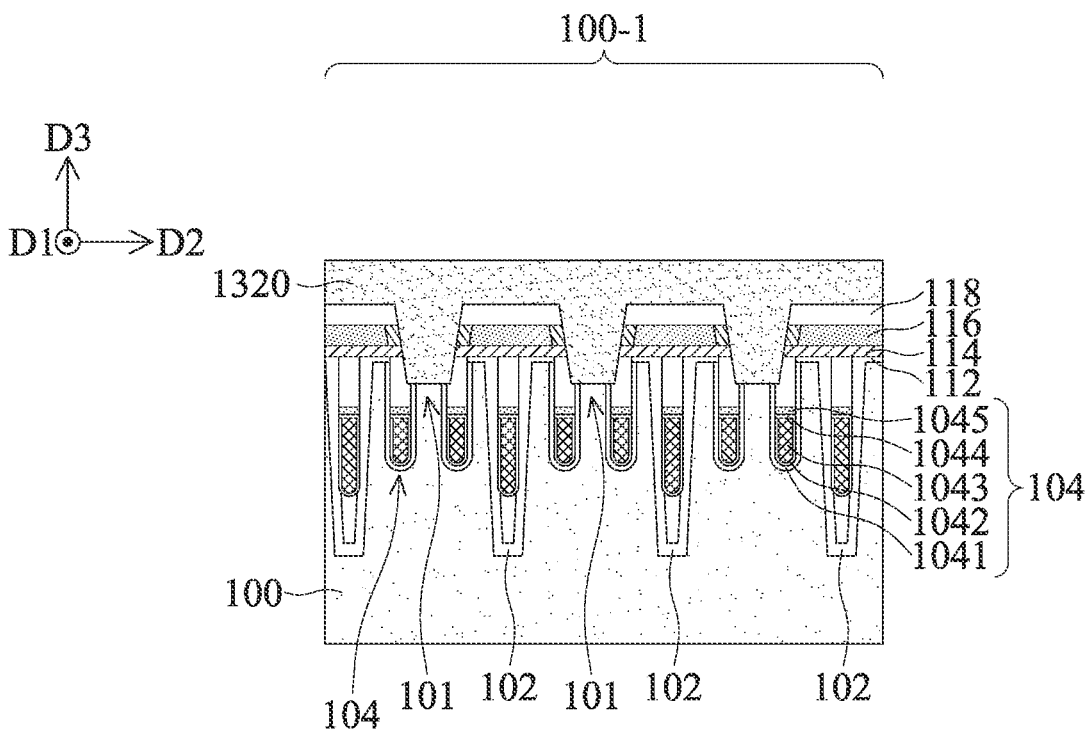

Next, referring to FIG. 3C, in some embodiments, the mask layer 120 is removed to expose the top surface of the mask layer 118. Next, a conductive material layer 1320 is deposited on the substrate 100. The conductive material layer 1320 covers the mask layer 118 and fully fills the contact openings 121. In this step, the conductive material layer 1320 is in contact with the sidewalls of the mask layer 118, the doping regions 126 in the contact openings 121, the dielectric material layer (e.g., the oxide layer 114 and the nitride layer 112), the insulating layers 1046 on the buried word lines 104 and the active regions 101 of the substrate 100.

The conductive material layer 1320 includes doped polysilicon, metal, metal nitride, or another suitable material. In one embodiment, the conductive material layer 1320 can be formed by using a deposition process such as PVD, CVD, ALD, or another suitable process. In one exemplified embodiment, the conductive material layer 1320 includes polysilicon doped with n-type dopants or p-type dopants, thereby decreasing the resistance between the contacts and the bit lines that are fabricated in the subsequent processes.

If the semiconductor material layer 116 is a polysilicon layer, the sidewalls 116s of the polycrystalline semiconductor material layer 116 that is originally formed can be transformed into amorphous doping regions 126 after pre-amorphization ion implantation is performed. Therefore, it is difficult to rapidly form chemical bonds between the conductive material layer 1320 and the amorphous doping regions 126, thereby slowing down the deposition rate of the portion of the conductive material layer 1320 that is adjacent to the sidewalls 116s of the semiconductor material layer 116. Accordingly, the method of manufacturing the semiconductor device can solve the conventional problem of the seams 133 that occur when the conductive material layer 1320 fills the contact openings 121 (FIG. 2B).

Figure 3D:
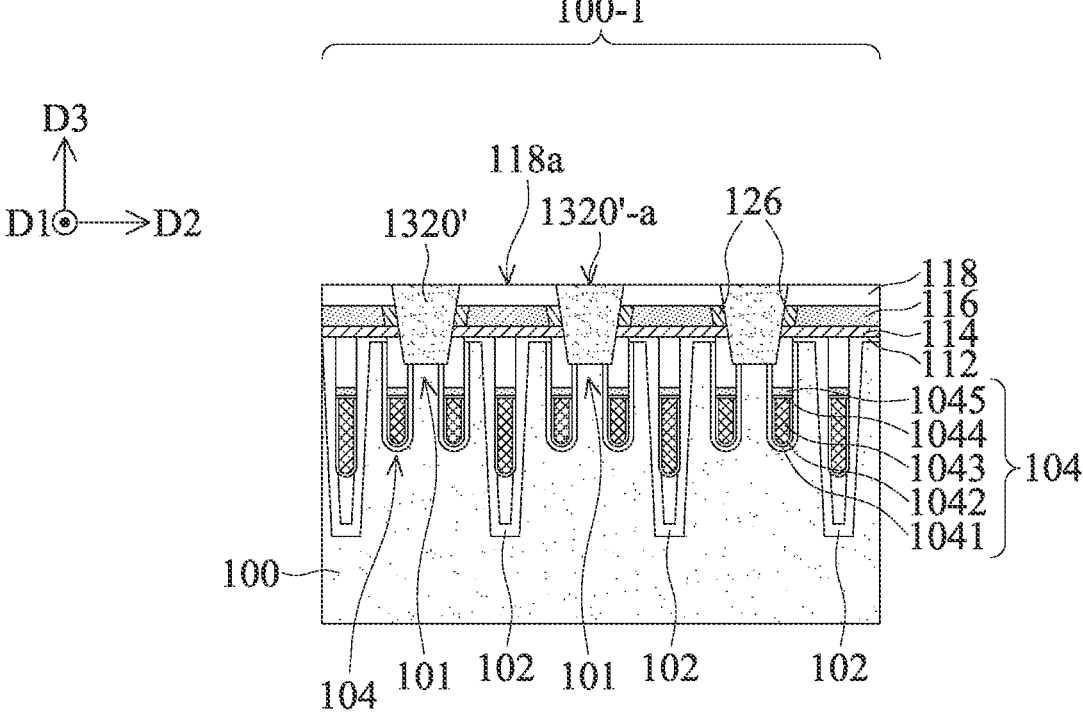

Next, referring to FIG. 3D, the excess portion of the conductive material layer 1320 above the top surface 118a of the mask layer 118 is removed, in accordance with some embodiments of the present disclosure. The remaining portions of the conductive material layer 1320 can be referred to as the conductive layers 1320' that fill up the respective contact openings 121. In some embodiments, after the excess portion of the conductive material layer 1320 is removed, the top surfaces 1320'-a of the remaining conductive layers 1320' are coplanar with the top surface 118a of the mask layer 118. In addition, the excess portion of the conductive material layer 1320 may be removed by a chemical mechanical polishing (CMP) process.

Figure 3E:
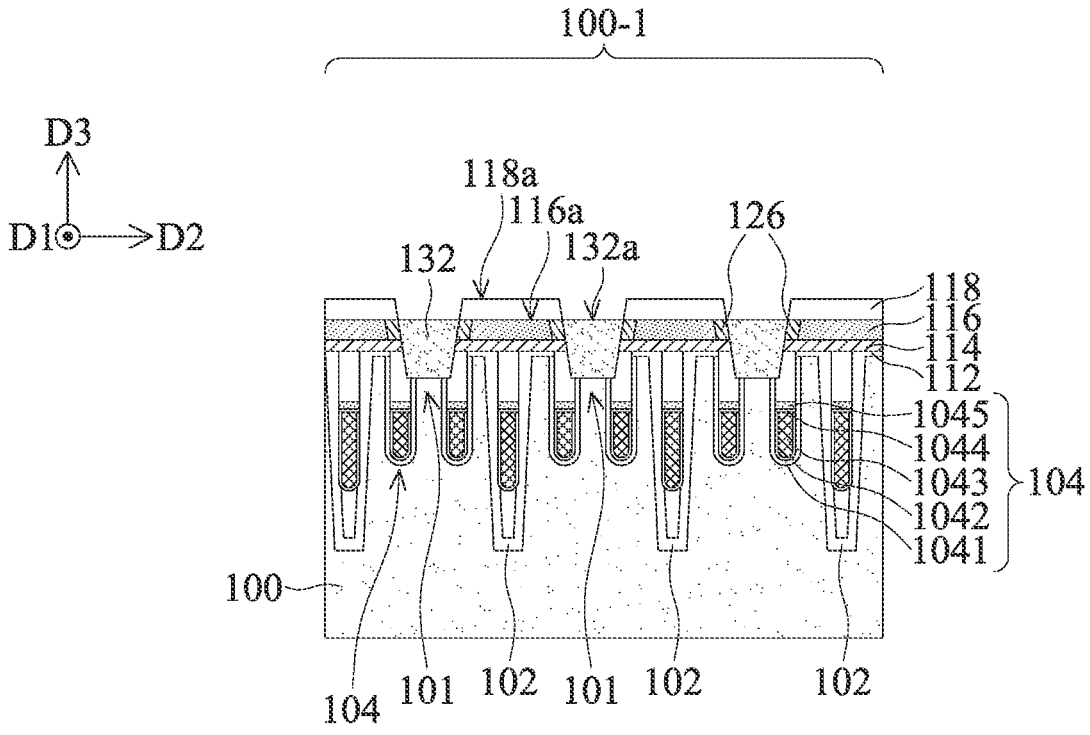

Next, referring to FIG. 3E, the conductive layers 1320' in the respective contact openings 121 are recessed to form the contacts 132, in accordance with some embodiments of the present disclosure. For example, the conductive layers 1320' can be recessed by an etching back process, so that the top surfaces of the remaining portions of the conductive layers 1320' (that form the contacts 132) are lower than the top surface 118a of the mask layer 118, as shown in FIG. 3E. The recessed conductive layers 1320' expose the sidewalls of the mask layer 118. The top surfaces 132a of the formed contacts 132 are, for example, substantially coplanar with the top surface 116a of the semiconductor material layer 116.

Figure 3F:
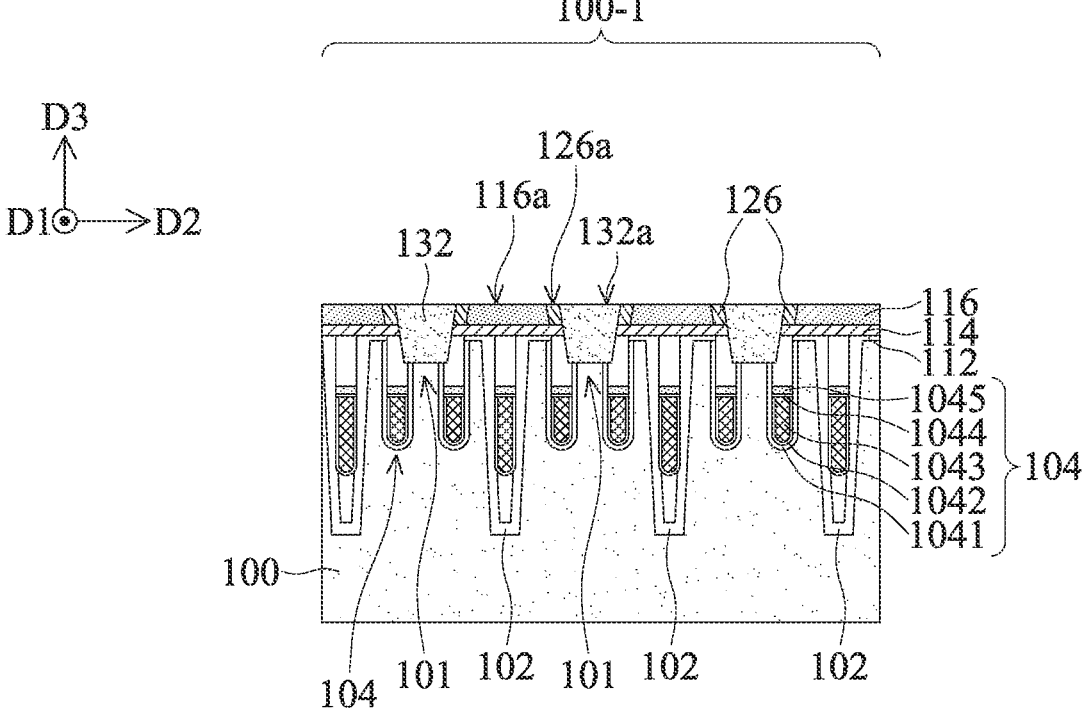

Next, referring to FIG. 3F, the mask layer 118 is removed to expose the top surface of the semiconductor material layer 116, in accordance with some embodiments of the present disclosure. The top surfaces 132a of the contacts 132 are substantially coplanar with the top surfaces 126a of the doping regions 126 and the top surface 116a of the semiconductor material layer 116.

Figure 3G:
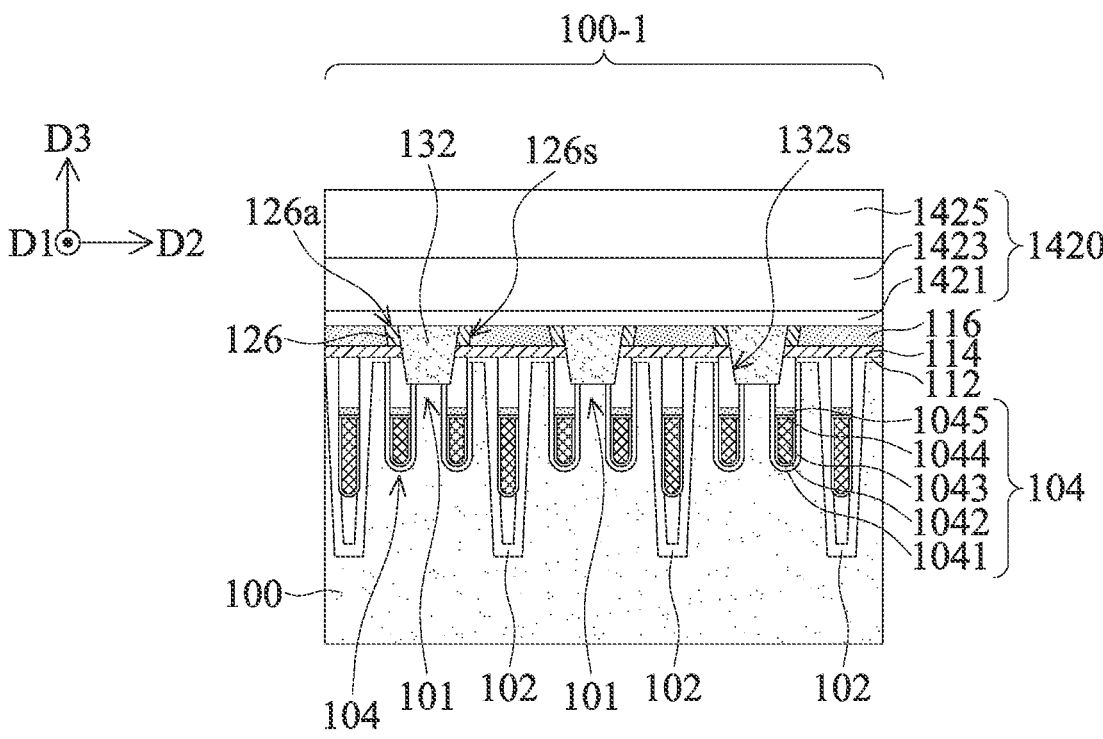
Figure 3H:
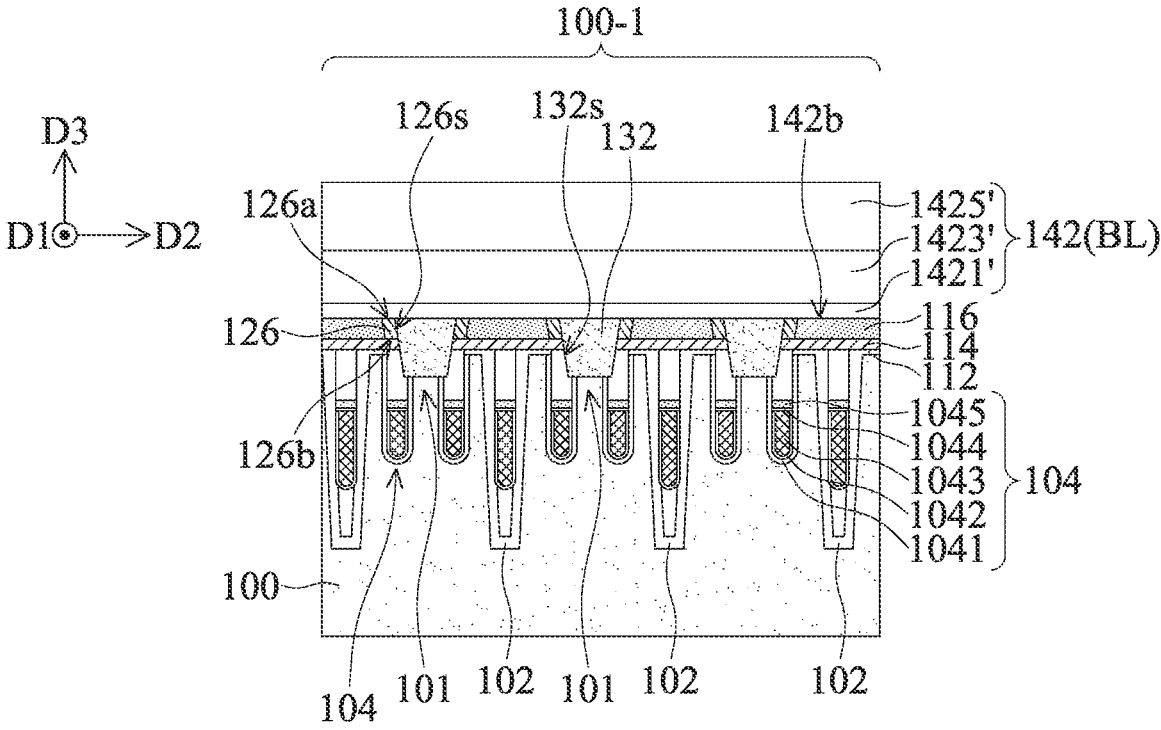

Referring to FIG. 3G, a stack of bit line material layers 1420 is formed on the semiconductor material layer 116 and the contacts 132, in accordance with some embodiments of the present disclosure. The stack of bit line material layers 1420 sequentially includes a conductive layer 1421, another conductive layer 1423 and a dielectric layer 1425 from bottom to top.

The conductive layers 1421 and 1423 may include doped polysilicon, metal, metal nitride, or another suitable material. For example, the conductive layers 1421 and 1423 may include W, Ti, TiN, or a combination of foregoing materials. In one exemplified embodiment, the conductive layer 1421 is a TiN layer and the conductive layer 1423 is a W layer.

The dielectric layer 1425 may include silicon nitride, silicon oxide, another suitable dielectric material or a combination of the forgoing materials. The dielectric layer 1425 can be a single layer structure or a multilayer structure. To simplify the diagram, a single-layer dielectric layer 1425 is depicted for clear illustrations.

In one embodiment, the conductive layer 1421, the conductive layer 1423 and the dielectric layer 1425 of the stack of bit line material layers 1420 can be formed by using suitable deposition processes. The deposition processes for forming the conductive layer 1421, the conductive layer 1423 and the dielectric layer 1425 are similar to the above-mentioned deposition processes, and they will not be repeated here for the sake of simplicity and clarity.

Next, one or more patterning processes are performed on the stack of bit line material layers 1420 to form several bit lines 142. In some embodiments, referring to FIG. 3H, a patterning process is performed on the conductive layer 1421, the conductive layer 1423 and the dielectric layer 1425 of the stack of bit line material layers 1420 to form the bit lines 142. Each of the bit lines 142 includes a patterned conductive layer 1421', a patterned conductive layer 1423' and a patterned dielectric layer 1425'. In addition, after the patterning process, the formed bit lines 142 extend in the direction D2, and each of the bit lines 142 has a narrower width (not shown) in the direction D1. In addition, the bit lines 142 are in contact with the underlying contacts 132, the doping regions 126 and the semiconductor material layer 116, in accordance with some embodiments of the present disclosure.

After the bit lines 142 are formed, other components/layers are formed for manufacturing the semiconductor device. In some embodiments, the dielectric liners can be formed on the sidewalls of the bit lines 142, and additional components/layers such as capacitor contacts, capacitors and metal layers are formed for manufacturing the semiconductor device. After the aforementioned components/layers are formed, the fabrication of a memory device (such as DRAM) is completed.

According to the semiconductor structure and the method of manufacturing the semiconductor structure in the embodiment of the present disclosure, the semiconductor material layer 116 extends from the array region 100-1 to the peripheral region 100-2. The semiconductor material layer 116 is disposed between the bit lines 142 and the substrate 100. A portion of the semiconductor material layer 116 that extends in the peripheral area 100-2 can form parts of the peripheral wires in the subsequent process. It is not necessary to remove the remaining portion of the semiconductor material layer 116 that extends in the array area 100-1, so as to reduce the manufacturing cost of the semiconductor structure. In addition, a surface treatment is performed on the sidewalls 116s of the semiconductor material layer 116 that are exposed in the contact openings 121, such as forming amorphous doping regions 126, in accordance with some embodiments of the present disclosure. It is difficult to rapidly form chemical bonds between the amorphous doping regions 126 and a conductive material layer (that forms contacts in the subsequent process), thereby slowing down the deposition rate of the portion of the conductive material layer 1320 that is adjacent to the sidewalls 116s of the semiconductor material layer 116 and preventing occurrence of the seams 133 (FIG. 2B). Accordingly, the semiconductor structure and the method of manufacturing the semiconductor structure in the embodiment, in particular, the semiconductor structure with small dimensions, can save manufacturing cost and have relatively simple procedures. In addition, the relative components of the semiconductor structure as formed have good configurations and profiles, for example, the contacts 132 without any seam can be formed. Thus, the semiconductor structure as formed have good electrical characteristics. Accordingly, the semiconductor structure manufactured by the method of the embodiments has reliable and stable operation performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate that comprises active regions and isolation structures, and the isolation structures surround the active regions;
   buried word lines disposed in the substrate;
   a dielectric material layer formed on the substrate;
   a semiconductor material layer formed on the dielectric material layer;

contacts adjacent to the semiconductor material layer, wherein the contacts penetrate the semiconductor material layer, the dielectric material layer and parts of the substrate, and the contacts are positioned in the respective active regions; and a plurality of doping regions, wherein the doping regions are disposed between the semiconductor material layer and the respective contacts, so that the semiconductor material layer is separated from the contacts, wherein top surfaces of the contacts are coplanar with top surfaces of the doping regions.

2. The semiconductor structure as claimed in claim 1, wherein the substrate includes an array region and a periphery region, and the semiconductor material layer extends over the array region and the periphery region, and wherein the active regions and the contacts are positioned in the array region, and a portion of the semiconductor material layer that extends over the periphery region is a part of peripheral conductive wires.

3. The semiconductor structure as claimed in claim 2, wherein the semiconductor material layer includes:

a first semiconductor material portion formed in the array region; and a second semiconductor material portion formed in the periphery region to form the part of peripheral conductive wires.

4. The semiconductor structure as claimed in claim 1, wherein top surfaces of the contacts are coplanar with top surface of the semiconductor material layer.

5. The semiconductor structure as claimed in claim 1, wherein the contacts and the semiconductor material layer are made of the same material.

6. The semiconductor structure as claimed in claim 1, further comprising:

a plurality of bit lines formed on the contacts and the semiconductor material layer, wherein top surfaces of the doping regions are in contact with bottom surfaces of the plurality of bit lines, and wherein the buried word lines extend in a first direction, the plurality of bit lines extend in a second direction, and the first direction is different from the second direction.

7. A method of manufacturing the semiconductor structure of claim 1, comprising:

providing the substrate, wherein the substrate comprises the active regions and the isolation structures that surround the active regions, and the buried word lines disposed in the substrate;

forming the dielectric material layer on the substrate;

forming the semiconductor material layer on the dielectric material layer;

forming contact openings that penetrate the semiconductor material layer, the dielectric material layer and parts of the substrate, wherein the contact openings expose the substrate; and forming the contacts in the contact openings, wherein the contacts are disposed adjacent to the semiconductor material layer, and the contacts are positioned in the respective active regions.

8. The method of manufacturing the semiconductor structure as claimed in claim 7, wherein the substrate includes an array region and a periphery region, and the semiconductor material layer extends over the array region and the periphery region, and wherein the active regions and the contacts are positioned in the array region.

9. The method of manufacturing the semiconductor structure as claimed in claim 7, wherein top surfaces of the contacts are coplanar with a top surface of the semiconductor material layer.

10. The method of manufacturing the semiconductor structure as claimed in claim 7, wherein after the contact openings are formed to expose the substrate, the method further comprises:

forming a plurality of doping regions on sidewalls of the semiconductor material layer, wherein the plurality of doping regions are exposed in the contact openings.

11. The method of manufacturing the semiconductor structure as claimed in claim 10, wherein a pre-amorphization implantation is performed on the sidewalls of the semiconductor material layer that are exposed in the contact openings.

12. The method of manufacturing the semiconductor structure as claimed in claim 10, wherein after the contacts are formed, the doping regions are disposed between the semiconductor material layer and the respective contacts, so that the semiconductor material layer is separated from the contacts.

13. The method of manufacturing the semiconductor structure as claimed in claim 10, further comprising:

forming a plurality of bit lines on the contacts and the semiconductor material layer, wherein top surfaces of the doping regions are in contact with bottom surfaces of the plurality of bit lines, and wherein the buried word lines extend in a first direction, the plurality of bit lines extend in a second direction, and the first direction is different from the second direction.

14. The method of manufacturing the semiconductor structure as claimed in claim 10, further comprising:

forming a first mask layer on the semiconductor material layer and forming a second mask layer on the first mask layer;

forming the contact openings to penetrate the second mask layer, the first mask layer, the semiconductor material layer, the dielectric material layer and the parts of the substrate, wherein the contact openings expose the substrate;

removing the second mask layer, wherein a top surface of the first mask layer is exposed after the second mask layer is removed;

depositing a conductive material layer over the substrate, wherein the conductive material layer covers the first mask layer and fully fills the contact openings;

removing portions of the conductive material layer over the top surface of the first mask layer, wherein a remaining portion of the conductive material layer in each of the contact openings is referred to as a conductive layer;

recessing the conductive layers in the contact openings to form the contacts, wherein sidewalls of the first mask layer are exposed after the conductive layers in the contact openings are recessed; and removing the first mask layer.

15. The semiconductor structure as claimed in claim 1, wherein the semiconductor material layer includes a polysilicon layer.

16. The semiconductor structure as claimed in claim 1, wherein the doping regions include amorphous material.

17. The semiconductor structure as claimed in claim 1, wherein bottom surfaces of the doping regions are in contact with the dielectric material layer.

18. The semiconductor structure as claimed in claim 17, wherein the dielectric material layer includes:

a nitride layer formed on a top surface of the substrate; and an oxide layer formed on the nitride layer, wherein the bottom surfaces of the doping regions are in contact with a top surface of the oxide layer.

\* \* \* \* \*